(12) United States Patent
Ikarashi et al.

(10) Patent No.: US 9,362,110 B2
(45) Date of Patent: Jun. 7, 2016

(54) SEMICONDUCTOR DEVICE AND METHOD OF MANUFACTURING THE SEMICONDUCTOR DEVICE

(71) Applicant: Renesas Electronics Corporation, Kawasaki-shi, Kanagawa (JP)

(72) Inventors: Nobuyuki Ikarashi, Kanagawa (JP); Takashi Onizawa, Kanagawa (JP); Motofumi Saitoh, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/466,966

(22) Filed: Aug. 23, 2014

(65) Prior Publication Data
US 2014/0363982 A1 Dec. 11, 2014

Related U.S. Application Data

(62) Division of application No. 13/734,844, filed on Jan. 4, 2013, now Pat. No. 8,872,234.

(30) Foreign Application Priority Data

Jan. 4, 2012 (JP) .................. 2012-000164

(51) Int. Cl.
*H01L 21/338* (2006.01)
*H01L 21/02* (2006.01)
(Continued)

(52) U.S. Cl.
CPC .... *H01L 21/02178* (2013.01); *H01L 21/28264* (2013.01); *H01L 21/324* (2013.01);
(Continued)

(58) Field of Classification Search
CPC .................. H01L 21/02296; H01L 21/02299; H01L 21/02318
USPC .................................................. 438/590, 779
See application file for complete search history.

(56) References Cited

U.S. PATENT DOCUMENTS 7,030,428 B2 4/2006 Saxler
7,226,850 B2 6/2007 Hoke et al.
(Continued)

FOREIGN PATENT DOCUMENTS

JP 2004-273630 A 9/2004
JP 2005-183597 A 7/2005
(Continued)

OTHER PUBLICATIONS

Office Action issued Apr. 28, 2015, in Japanese Patent Application No. 2012-000164.
(Continued)

*Primary Examiner* — Chandra Chaudhari
(74) *Attorney, Agent, or Firm* — Shapiro, Gabor and Rosenberger, PLLC

(57) ABSTRACT

A first nitride semiconductor layer contains Ga. The first nitride semiconductor layer is, for example, a GaN layer, an AlGaN layer, or an AlInGaN layer. Then, an aluminum oxide layer has tetra-coordinated Al atoms each surrounded by four ○ atoms and hexa-coordinated Al atoms each surrounded by six ○ atoms as Al atoms in the interface region with respect to the first nitride semiconductor layer. The interface region is a region apart, for example, by 1.5 nm or less from the interface with respect to the first nitride semiconductor layer. Then, in the interface region, the tetra-coordinated Al atoms are present by 30 at % or more and less than 50 at % based on the total number of Al atoms.

3 Claims, 11 Drawing Sheets

(51) Int. Cl.
  *H01L 29/778* (2006.01)
  *H01L 21/28* (2006.01)
  *H01L 29/51* (2006.01)
  *H01L 29/66* (2006.01)
  *H01L 29/78* (2006.01)
  *H01L 29/20* (2006.01)
  *H01L 21/324* (2006.01)
  *H01L 29/40* (2006.01)

(52) U.S. Cl.
  CPC .......... *H01L29/2003* (2013.01); *H01L 29/517* (2013.01); *H01L 29/66462* (2013.01); *H01L 29/66659* (2013.01); *H01L 29/778* (2013.01); *H01L 29/7786* (2013.01); *H01L 29/7835* (2013.01); *H01L 29/402* (2013.01)

(56) References Cited

U.S. PATENT DOCUMENTS 8,035,130 B2  10/2011  Nanjo et al.
8,748,274 B2  6/2014  Nakata et al.
2007/0207626 A1  9/2007  Nishi
2010/0117118 A1*  5/2010  Dabiran ................ H01L 29/207
                                                           438/478
2011/0215424 A1  9/2011  Sato
2011/0233689 A1  9/2011  Hata et al.

FOREIGN PATENT DOCUMENTS

JP  2007-088013 A  4/2007
JP  2007-235000 A  9/2007
JP  2010-45308 A  2/2010
JP  2010-161349 A  7/2010
JP  2010-166040 A  7/2010
JP  2011-187623 A  9/2011

OTHER PUBLICATIONS

Office Action issued Feb. 2, 2016, in Japanese Patent Application No. 2012-000164.

* cited by examiner

SEMICONDUCTOR DEVICE AND METHOD OF MANUFACTURING THE SEMICONDUCTOR DEVICE

CROSS-REFERENCE TO RELATED SPECIFICATIONS

The disclosure of Japanese Patent Application No. 2012-000164 filed on Jan. 4, 2012 including the specification, drawings, and abstract is incorporated herein by reference in its entirety.

BACKGROUND

The present invention concerns a semiconductor device and a method of manufacturing the semiconductor device and, it particularly relates to a semiconductor device having a structure of stacking an aluminum oxide film over a Ga-containing nitride semiconductor layer, and a method of manufacturing the semiconductor device.

When a transistor is formed by using a Ga-containing nitride semiconductor layer, candidates for the materials of gate insulating film includes various substances.

For example, Japanese Unexamined Patent Application Publication No. 2005-183597 describes investigation for the use of nitrogen-containing aluminum oxide layer as a gate insulating film.

Japanese Unexamined Patent Application Publication No. 2010-45308 describes that a material containing Al in the composition and having a spinel structure is used as a gate insulating film. As the material, $MgAl_2O_4$, $MnAl_2O$, $CoAl_2O_4$, and $NiAl_2O_4$ are shown as examples.

Japanese Unexamined Patent Application Publication No. 2004-273630 describes that an AlGaN layer is used as a gate insulating film.

Japanese Unexamined Patent Application Publication No. 2007-235000 describes that a silicon nitride film, a silicon oxide film, or a silicon oxynitride film is used as a gate insulating film.

SUMMARY

When an aluminum oxide layer is formed over a Ga-containing nitride semiconductor layer, many interface states are generated at the interface between the aluminum oxide layer and the nitride semiconductor layer. In this case, characteristics of a semiconductor device using the stacked structure are deteriorated.

According to an embodiment of the invention, an aluminum oxide layer is formed over a Ga-containing first nitride semiconductor layer. The aluminum oxide film has, as Al atoms, tetra-coordinated Al atoms each surrounded by four ○ atoms and hexa-coordinated Al atoms each surrounded by six ○ atoms as the Al atoms in an interface region situated in a region below 1.5 nm or less from the interface with respect to the first nitride semiconductor layer. Then, in the interface region, the tetra-coordinated Al atoms are present by 30 atom % or more and less than 50 atom % based on the entire Al atoms.

According to an embodiment of the invention, an interface layer comprising an aluminum oxide is formed on the Ga-containing nitride semiconductor, layer. The interface layer is heat treated in an atmosphere not containing an oxidizing agent. Then, an aluminum oxide layer is formed on the interface layer.

According to the embodiment described above, generation of the interface states at the interface between the Ga-containing nitride semiconductor and the aluminum oxide layer is suppressed.

DETAILED DESCRIPTION

Preferred embodiments of the present invention are to be described with reference to the drawings. Throughout the drawings, identical configurational elements carry same references for which description is to be omitted optionally.

First Embodiment

Figure 1:
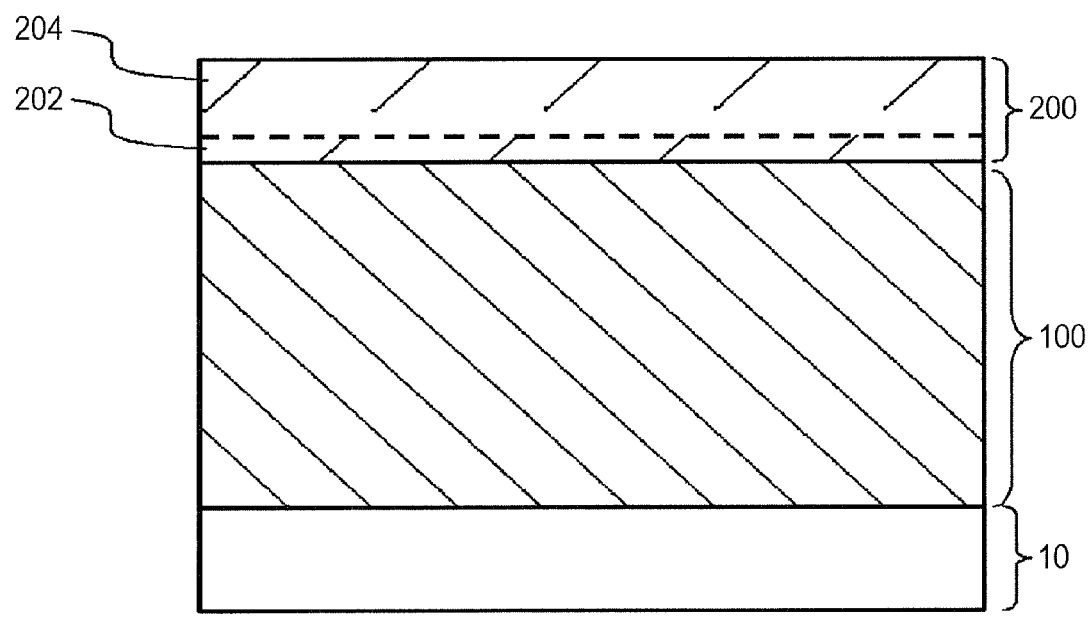
FIG. 1 is a view showing a layer structure used in a semiconductor device according to a first embodiment.

FIG. 1 is a view showing a layer structure used in a semiconductor device according to a first embodiment. The semiconductor device includes a first nitride semiconductor layer 100 and an aluminum oxide layer 200. The first nitride semiconductor layer 100 contains Ga. The first nitride semiconductor layer 100 is, for example, a GaN layer, an AlGaN layer, or an AlInGaN layer. Then, the aluminum oxide layer 200, as Al atoms, has tetra-coordinated Al atoms each surrounded by four atoms and hexa-coordinated Al atoms each surrounded by six O atoms in an interface region with respect to the first nitride semiconductor layer 100.

The interface region is a region apart, for example, by 1.5 nm or less from the interface with respect to the first nitride semiconductor layer 100. However, the interface region may also be a region apart by 3 nm or less from the interface with respect to the first nitride semiconductor layer 100 or may be a region apart by 2 atom layer or a 3 atom layer from the interface with respect to the first nitride semiconductor layer 100. In the interface region, tetra-coordinated Al atoms are present by 30 at % or more and less than 50 at %, preferably, 35 at % or more and less than 45 at % or more based on the total number of Al atoms. The interface region comprises, for example, 90 at % or more of $\gamma$-$Al_2O_3$ but the region may also have other crystal structures (including amorphous state).

In this configuration, joining between the aluminum oxide layer 200 and the first nitride semiconductor layer 100 in the interface region is improved and generation of interface states at the interface between the first nitride semiconductor layer 100 and the aluminum oxide layer 200 can be suppressed.

The present inventors estimate the reason as described below. At first, Ga oxides are formed inevitably on the surface of the first nitride semiconductor layer 100. The amount of the Ga oxides corresponds, for example, to a 1 atom layer or a 2 atom layer. The Ga oxides do not entirely cover the surface of the first nitride semiconductor layer 100 but may be formed sometimes in an island pattern. The most stable structure of the Ga oxides is $\beta$-$Ga_2O_3$. In $\beta$-$Ga_2O_3$, about 40% of Ga atoms are surrounded each by four O atoms and about 60% of the remaining atoms are surrounded each by six O atoms. Accordingly, formation of the surface states is suppressed by arranging such that about 40% of the Al atoms are surrounded each by four O atoms and about 60% of the remaining atoms are surrounded each by six O atoms.

In this embodiment, an interface layer 202 comprising aluminum oxide is formed as the interface region of the aluminum oxide layer 200. A main body layer 204 comprising aluminum oxide is formed on the interface layer 202. The thickness of the main body layer is, for example, 10 nm or more and 100 nm or less. Since the interface layer 202 and the main body layer 204 are formed of an identical material, the interface between the interface layer 202 and the main body layer 204 is sometimes indistinct.

The first nitride semiconductor 100 is formed over a substrate 10. The first nitride semiconductor layer 100 is an epitaxially grown film. A buffer layer may also be formed between the first nitride semiconductor layer 100 and the substrate 10. The substrate 10 comprises, for example, an Si substrate.

Figure 2A:
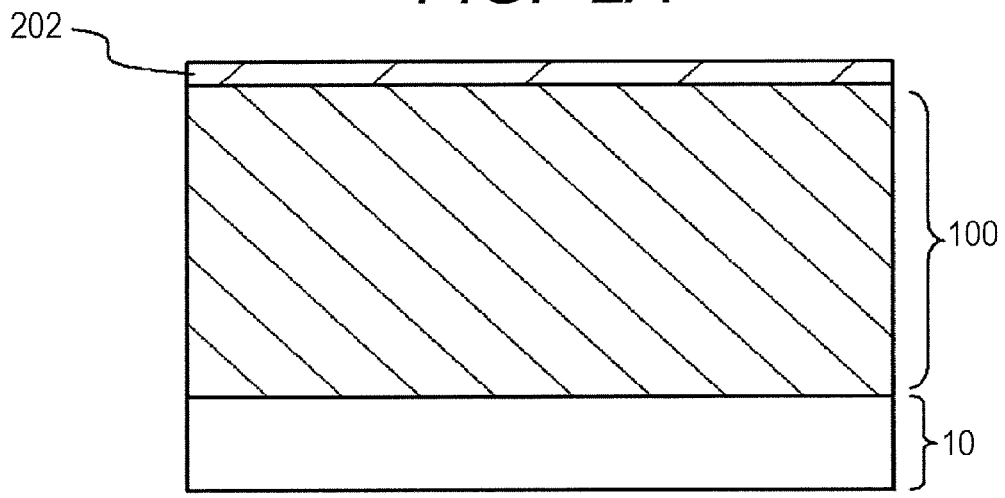
FIG. 2A is a view showing a method of forming a structure of the semiconductor device shown in FIG. 1.
Figure 2B:
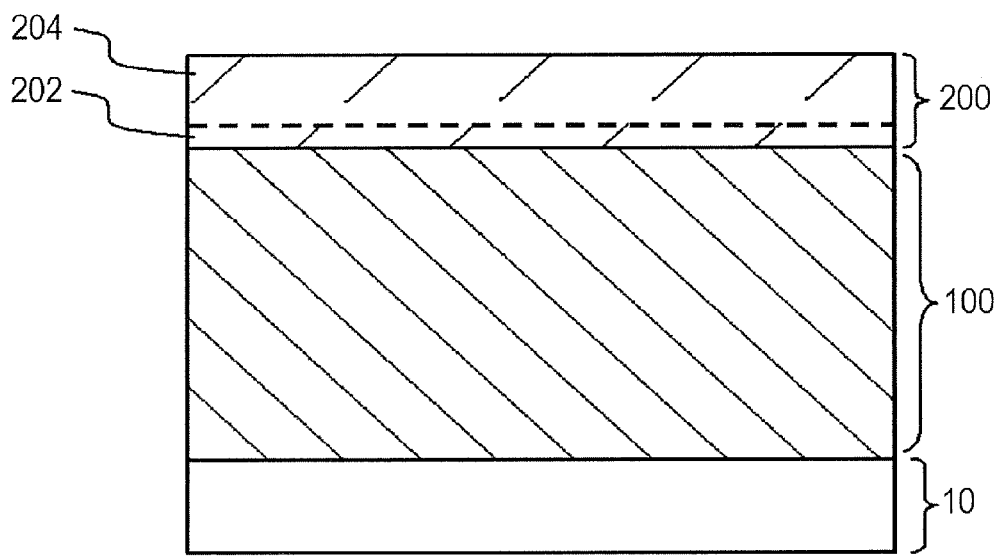
FIG. 2B is a view showing a method of forming a structure of the semiconductor device shown in FIG. 1.

FIG. 2 is a view showing a method of forming the structure of the semiconductor device shown in FIG. 1. At first, a first nitride semiconductor layer 100 is epitaxially grown over the substrate 10. Then, the surface of the first nitride semiconductor layer 100 is cleaned by a chemical solution such as hydrochloric acid. Then, a stacked structure of the substrate 10 and the first nitride semiconductor layer 100 is carried into a processing container for forming an aluminum oxide layer. The processing container is a container for forming an aluminum nitride layer, for example, by an atomic layer deposition (ALD) method.

Then, in the processing container, an aluminum oxide film layer containing an interface layer 202 is formed on the first nitride semiconductor layer 100. For this purpose, an aluminum oxide layer 200 of a desired thickness is deposited and then the aluminum oxide layer 200 is heat treated in the processing container in an atmosphere not containing an oxidizing agent. The atmosphere not containing the oxidizing agent is, for example, an atmosphere with an oxygen partial pressure of $0.2 \times 10^{-5}$ atm or less and this is, for example, a nitrogen gas atmosphere or an inert gas atmosphere such as an Ar gas. The heat treatment temperature is, for example, 500° C. or higher and 1,000° C. or lower. Further, the heat treating time is, for example, 1 minute or more and 5 minutes or less. The thickness of the formed interface layer 202 formed by the treatment is, for example, 1 nm or more and 3 nm or less. The thickness of the interface layer 202 may also be a 2 atom layer or more and a 4 atom layer or less. Conditions for the heat treatment are set within a range that the aluminum oxide layer 200 is not crystallized by the heat treatment.

By the processing, an aluminum oxide layer 200 having an main body layer 204 on the interface layer 202 is formed.

It can be confirmed whether the crystal structure of the aluminum oxide layer 200 at the interface with respect to the first nitride semiconductor layer 100 is as shown in this embodiment or not by using, for example, a transmission electron microscope-electron energy-loss spectroscopy (TEM-EELS) method.

Figure 3A:
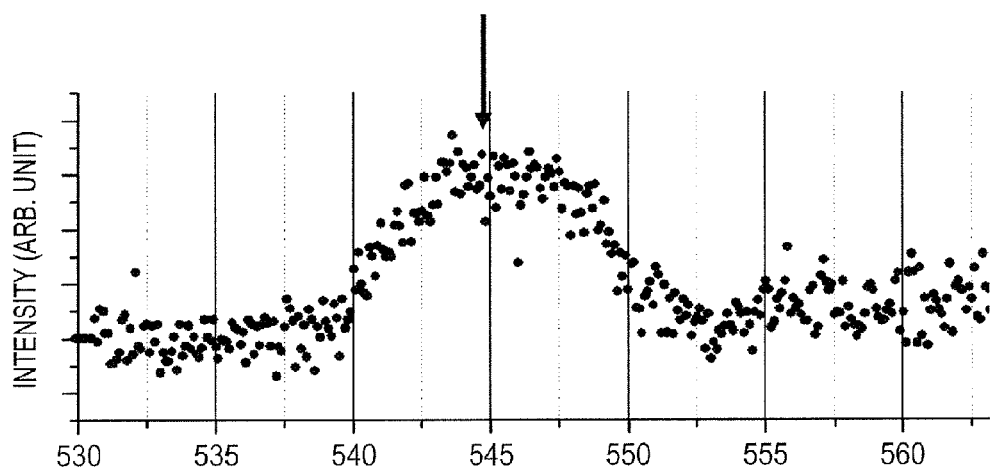
FIG. 3A is a view showing a TEM-EELS spectrum (0 K-edge) of an interface layer formed by the method shown in the first embodiment of the invention.
Figure 3B:
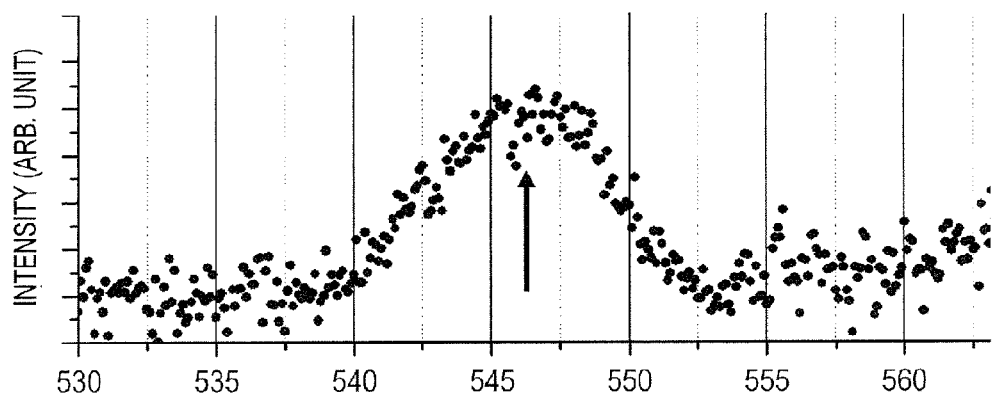
FIG. 3B is a view showing a TEM-EELS spectrum at the interface when a main body layer is formed directly over a nitride semiconductor layer of a comparative embodiment.

FIG. 3A shows a TEM-EELS spectrum (0 k-edge) of the interface layer 202 formed by the method shown in this embodiment, FIG. 3B shows a TEM-EELS spectrum of the main body layer 204 at the interface with the first nitride semiconductor layer 100. As shown in the drawings, the peak position for TEM-EEL spectrum of the interface layer 202 shown in this embodiment is different from the peak position of that of the comparative embodiment.

Figure 4:
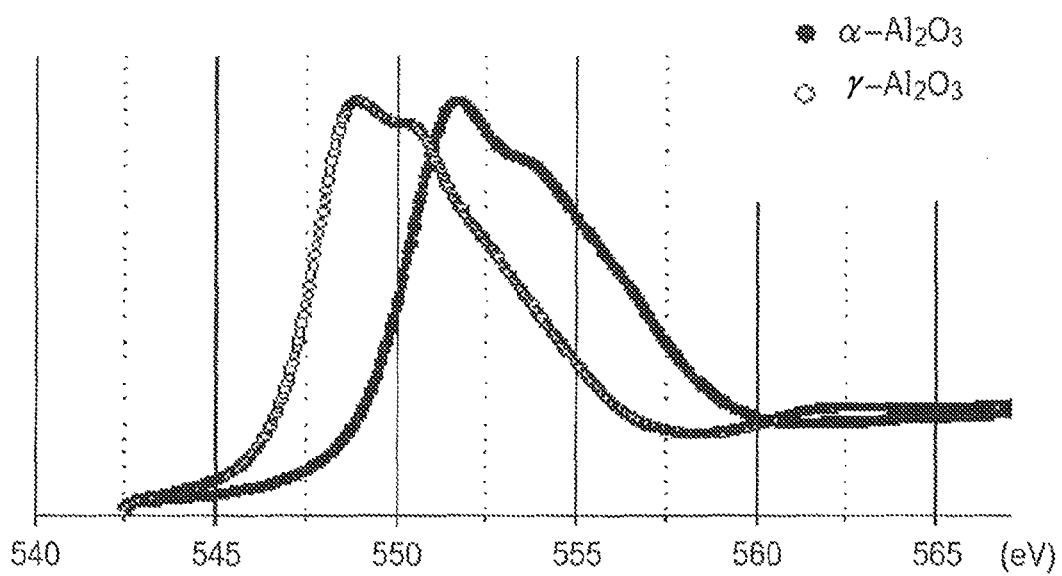
FIG. 4 is a view showing TEM-EELS spectra of $\alpha$-$Al_2O_3$ and $\gamma$-$Al_2O_3$.

The reason is to be described with reference to FIG. 4 and FIG. 5. FIG. 4 shows TEM-EELS spectra of $\alpha$-$Al_2O_3$ and $\gamma$-$Al_2O_3$. As shown in the drawing, the peak position of $\alpha$-$Al_2O_3$ is higher by about 2.5 eV than that of the $\gamma$-$Al_2O_3$. Then, in $\gamma$-$Al_2O_3$, tetra-coordinated Al atoms are present by 33% based on the entire Al atoms, whereas in $\alpha$-$Al_2O_3$, tetra-coordinated Al atoms occupy 0% of the entire Al atoms. In view of the above, it can be seen that the peak position in the TEM-EELS spectrum is displaced depending on the ratio of tetra-coordinated Al atoms.

Figure 5:
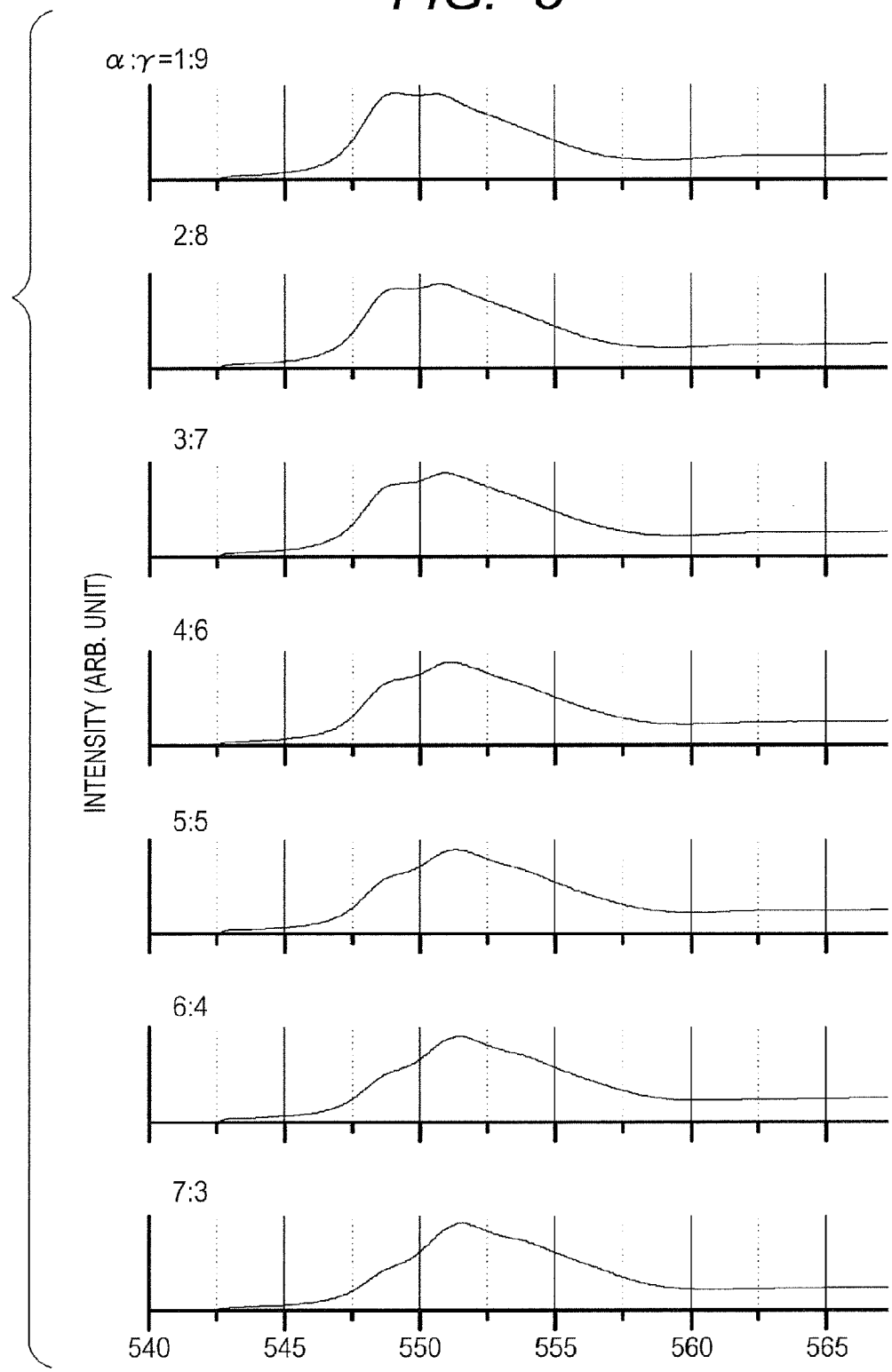
FIG. 5 shows a result of simulation showing the change of TEM-EELS spectra when the ratio of $\alpha$-$Al_2O_3$ and $\gamma$-$Al_2O_3$ is changed.

FIG. 5 shows the result of simulation showing the change of TEM-EELS spectrum when the ratio of $\beta$-$Al_2O_3$ and $\gamma$-$Al_2O_3$ is changed. For example, the ratio of the tetra-coordinated Al atoms in a specimen can be estimated by comparing the TEM-EELS spectrum obtained from the specimen with the spectra shown in FIG. 5.

Then, the function and the effect of this embodiment are to be described. According to this embodiment, generation of interface states at the interface between the first nitride semiconductor layer 100 and the aluminum oxide layer 200 can be suppressed. This was confirmed by actually preparing samples as described specifically below.

At first, a sample was prepared in accordance with the preferred embodiment described above. The film thickness of the interface layer 202 is 1.5 nm and the thickness of the main body layer 204 is 30 nm. In this case, a plurality of samples were prepared while varying the heat treatment temperature. Further, as a comparative embodiment, a sample which was not subjected to the treatment described in column 0021 and in which the interface layer was not formed was prepared.

Figure 6A:
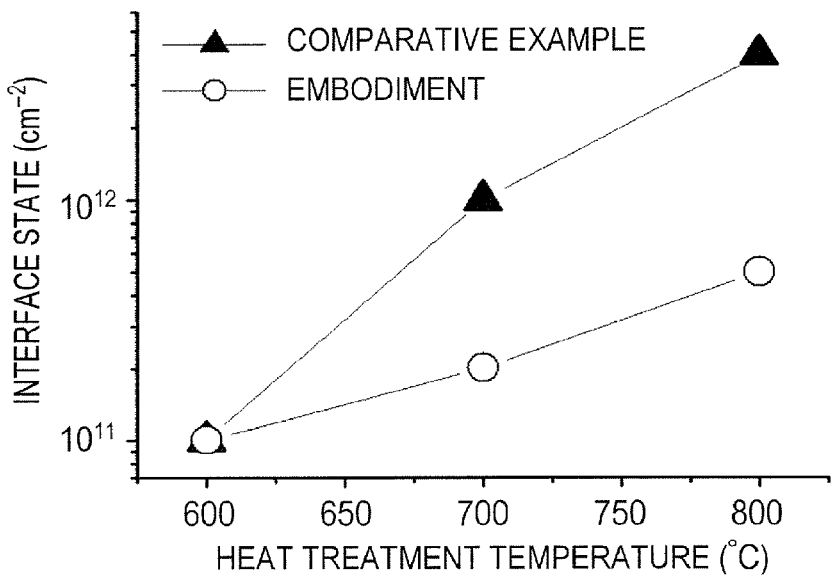
FIG. 6A is a view showing the result of measuring an interface state density at the interface between a nitride semiconductor layer and an aluminum oxide layer of a specimen according to a preferred embodiment and a specimen according to a comparative embodiment.

FIG. 6A shows a result of measuring the density of interface states at the interface between the first nitride semiconductor layer 100 and the aluminum oxide layer 200 for the specimen according to the preferred embodiment and the specimen according to the comparative embodiment. In view of the drawing, the interface states are decreased more in the sample according to the preferred embodiment than those of the comparative example. The trend becomes remarkable as the temperature of the heat treatment is higher.

Figure 6B:
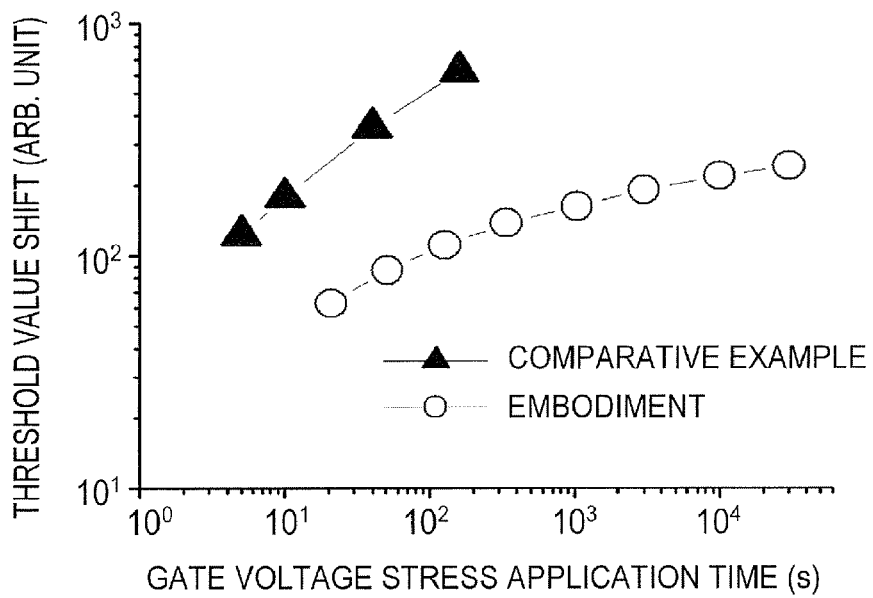
FIG. 6B is a view showing the result of measurement for BTI characteristics of a specimen according to the preferred embodiment and a specimen according to the comparative embodiment.

FIG. 6B shows a result of measurement of BTI characteristics of the sample according to the preferred embodiment and the sample according to the comparative embodiment. The measuring conditions are at a temperature of 150° C. and a gate voltage of 10 V. In any of the embodiments of the invention and that of the comparative embodiment, samples heat treated at a temperature of 800° C. were used. In view of the drawing, it can be seen that the sample according to the embodiment of the invention has better BTI characteristics than the sample according to the comparative embodiment. That is, the amount of shift of the threshold voltage of the transistor is small.

Second Embodiment

Figure 7:
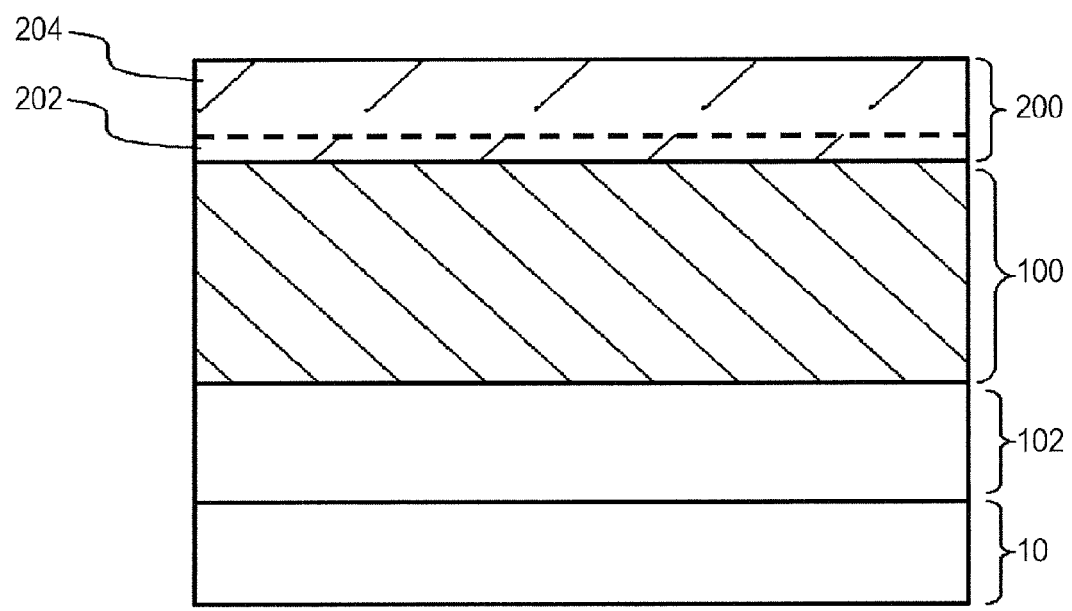
FIG. 7 is a cross sectional view showing a layer structure used for a semiconductor device according to a second embodiment.

FIG. 7 is a cross sectional view showing a layer structure used for a semiconductor device according to a second embodiment. This layer structure is identical with the layer structure of the first embodiment excepting that a second nitride semiconductor layer 102 is provided between a substrate 10 and a first nitride semiconductor layer 100. In this embodiment, the first nitride semiconductor layer 100 is an AlGaN layer or an AlInGaN layer. The second nitride semiconductor layer 102 is a GaN layer.

Also in this embodiment, the same effect as that of the first embodiment can be obtained.

Third Embodiment

Figure 8:
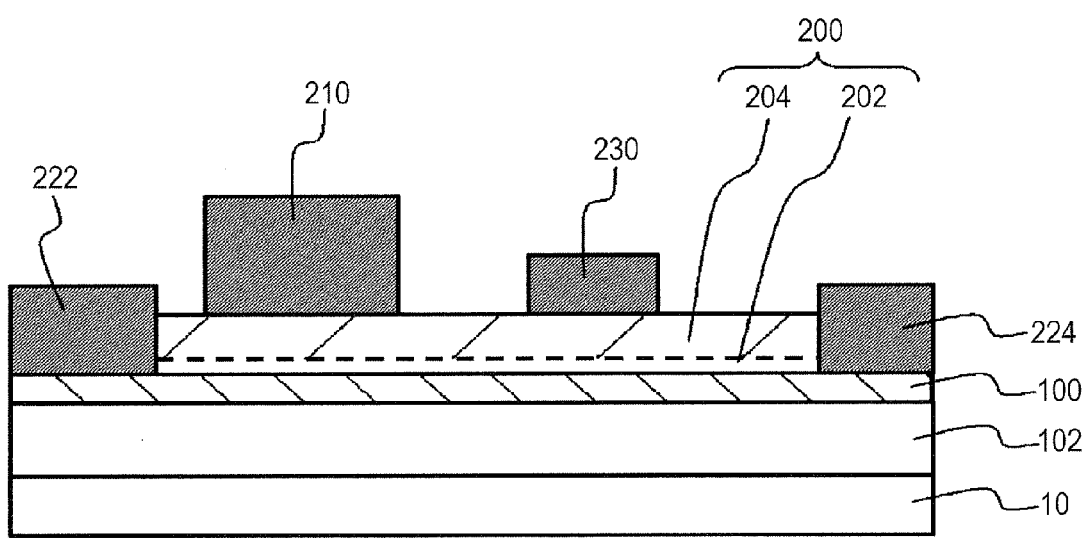
FIG. 8 is a view showing a configuration of a semiconductor device according to a third embodiment.

FIG. 8 is a view showing a configuration of a semiconductor device according to a third embodiment. The semiconductor device has an HEMT (High Electron Mobility Transistor). The HEMT is formed by using the layer structure shown in FIG. 7. Specifically, a second nitride semiconductor layer 102 and a first nitride semiconductor layer 100 are formed of materials having electron affinity different from each other. Accordingly, the second nitride semiconductor layer 102 and the first nitride semiconductor layer 100 forms hetero-junction at the interface. The first nitride semiconductor layer 100 functions as a supply layer for a two-dimensional electron gas, and the second nitride semiconductor layer 102 functions as a channel layer.

An aluminum oxide layer 200 is formed over the first nitride semiconductor layer 100. The aluminum oxide layer 200 includes an interface layer 202 and a main body layer 204, and functions as a gate insulating film of the HEMT. A gate electrode 210 is formed over an aluminum oxide layer 200. The gate electrode 210 is formed, for example, by a sputtering method or a CVD method.

A source electrode 222 and a drain electrode 224 are also formed over the first nitride semiconductor layer 100. The source electrode 222 and the drain electrode 224 are positioned on opposite sides of the gate electrode 210. The aluminum oxide layer 200 is not formed in the region of the first nitride semiconductor layer 100 where the source electrode 222 and the drain electrode 224 are positioned. Therefore, the source electrode 222 and the drain electrode 224 are directly connected to the first nitride semiconductor layer 100.

The distance from the gate electrode 210 to the drain electrode 224 is longer than the distance from the gate electrode 210 to the source electrode 222. This improves a gate to drain withstanding voltage. Further, a field plate electrode 230 is formed over a region of the aluminum oxide layer 200 which is situated between the gate electrode 210 and the drain electrode 224. The field plate electrode 230 is, for example, at an identical potential with the source electrode 222 (for example, ground potential). This further improves the gate to drain withstanding voltage.

Figure 9A:
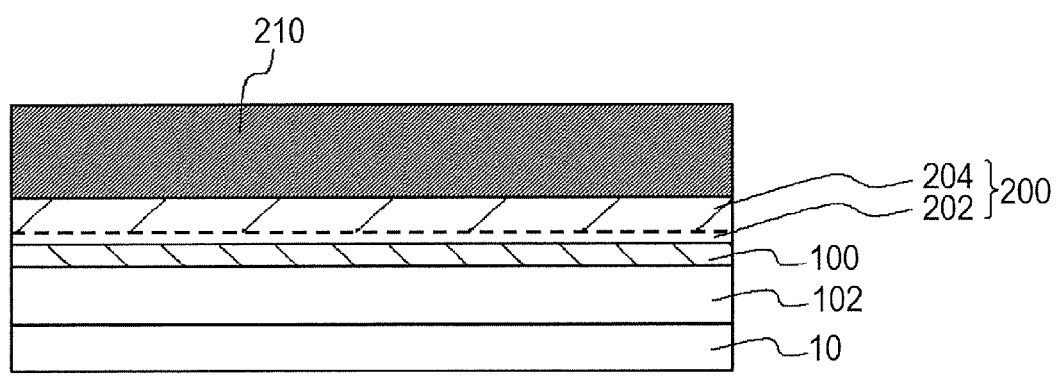
FIG. 9A is a cross sectional view showing a method of manufacturing the semiconductor device shown in FIG. 8.

FIG. 9 is a cross sectional view showing a method of manufacturing the semiconductor device shown in FIG. 8. At first, as shown in FIG. 9A, a substrate in which a second nitride semiconductor 102 is formed over a substrate 10 is prepared. Then, a first nitride semiconductor layer 100 is formed over the second nitride semiconductor layer 102. Then, an interface layer 202 and a main body layer 204 are formed over the first nitride semiconductor layer 100. The method of forming them is as has been described for the first embodiment.

Then, an electroconduction film as a gate electrode 210 is formed over an aluminum oxide layer 200. The electroconductive film is formed by using, for example, a sputtering method or a CVD method.

Figure 9B:
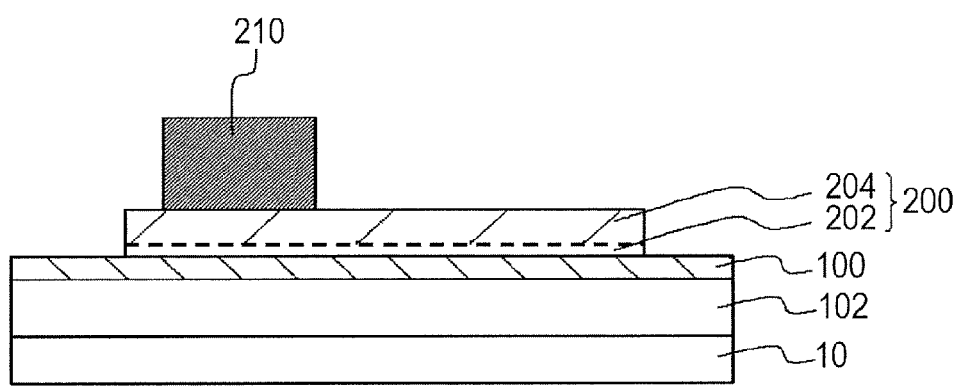
FIG. 9B is a cross sectional view showing a method of manufacturing the semiconductor device shown in FIG. 8 succeeding to the step shown in FIG. 9A.

Then, as shown in FIG. 9B, a resist pattern is formed over the electroconductive film as the gate electrode 210 and the electroconductive film is removed selectively by using the resist pattern as a mask. Thus, the gate electrode film 210 is formed. Then, the resist pattern is removed. Then, a resist pattern is formed over the gate electrode 210 and over the aluminum oxide layer 200, and the aluminum oxide layer 200 is removed selectively by using the gate pattern as a mask. Thus, portions of the first nitride semiconductor layer 100 to be connected with a source electrode 222 and a drain electrode 224 are exposed from the aluminum oxide layer 200. Subsequently, the resist pattern is removed. However, the patterning method of the gate electrode 210 and the aluminum oxide layer 200, and the order of the steps are not restricted to the example described above.

Then, an electroconductive film is formed over the first nitride semiconductor layer 100, over the aluminum oxide layer 200, and over the gate electrode 210, and the electroconductive film is removed selectively. Thus, a source electrode 222 and a drain electrode 224 are formed.

According to this embodiment, interface states between the aluminum oxide layer 200 as the gate insulating film and the first nitride semiconductor layer 100 are decreased. Accordingly, characteristics of the HEMT, for example, BTI are improved.

Fourth Embodiment

Figure 10:
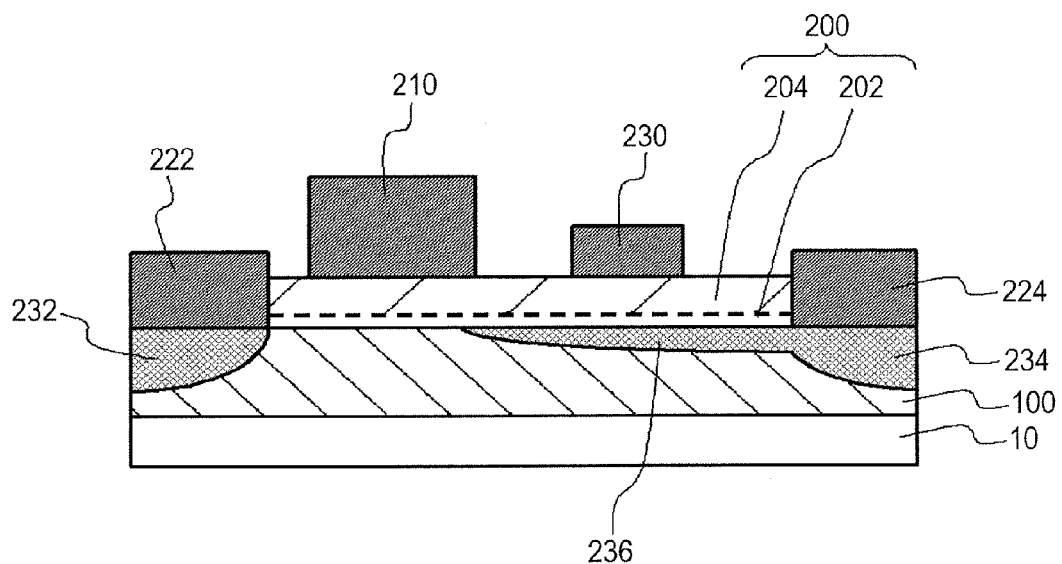
FIG. 10 is a cross sectional view showing a configuration of a semiconductor device according to a fourth embodiment.

FIG. 10 is a cross sectional view showing a configuration of a semiconductor device according to a fourth embodiment. The semiconductor device has a field effect transistor. The transistor is formed by using the layer structure shown in FIG. 1. In this embodiment, a first nitride semiconductor layer 100 comprises, for example, GaN.

A source region 232, a drain region 234, and an LDD region 236 are formed in the first nitride semiconductor layer 100. Each of the regions is formed, for example, by introducing an impurity into the first nitride semiconductor layer 100. The impurity is, for example, Si when the source region 232, the drain region 234, and the LDD region 236 are N-type, and the impurity is, for example, Mg when they are P-type. In a plan view, the source region 232 and the drain region 234 are opposed to each other by way of the aluminum oxide layer 200.

A source electrode 222 is connected to the source region 232 and a drain electrode 224 is connected to the drain region 234. Further, a gate electrode 210 and a field plate electrode 230 are formed over the aluminum oxide layer 200. The layout for the source electrode 222, the gate electrode 210, the field plate electrode 230, and the drain electrode 224 is identical with that of the example shown in FIG. 8.

FIG. 11 is a cross sectional view showing a method of manufacturing the semiconductor device shown in FIG. 10. At first, the structure shown in FIG. 9B in the third embodiment is prepared. The method of forming the structure is identical with that of the third embodiment.

Figure 11A:
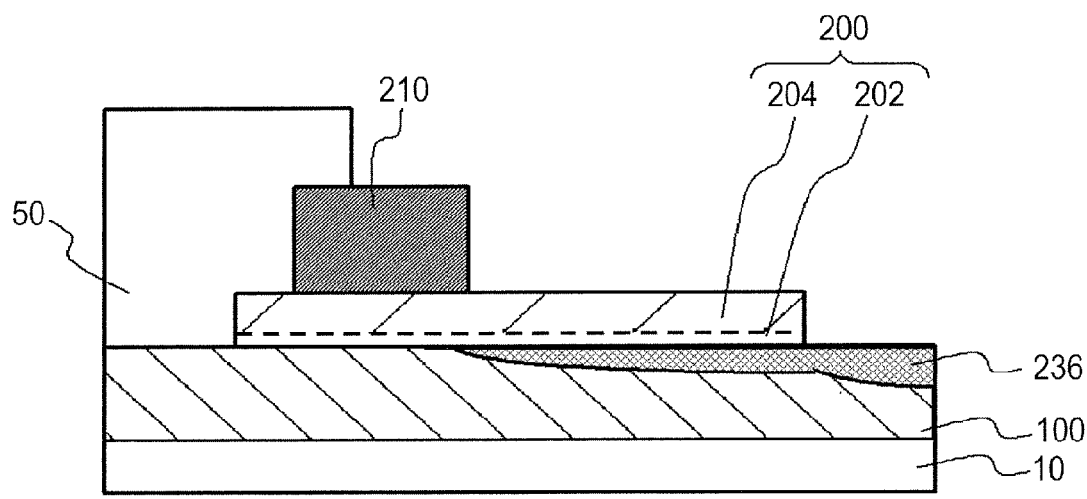
FIG. 11A is a cross sectional view showing a method of manufacturing the semiconductor device shown in FIG. 10.

Then, as shown in FIG. 11A, a resist pattern 50 is formed and an impurity is implanted into the first nitride semiconductor layer 100 by using the resist pattern 50 and the gate electrode 210 as a mask. Thus, an LDD region 236 is formed.

Figure 11B:
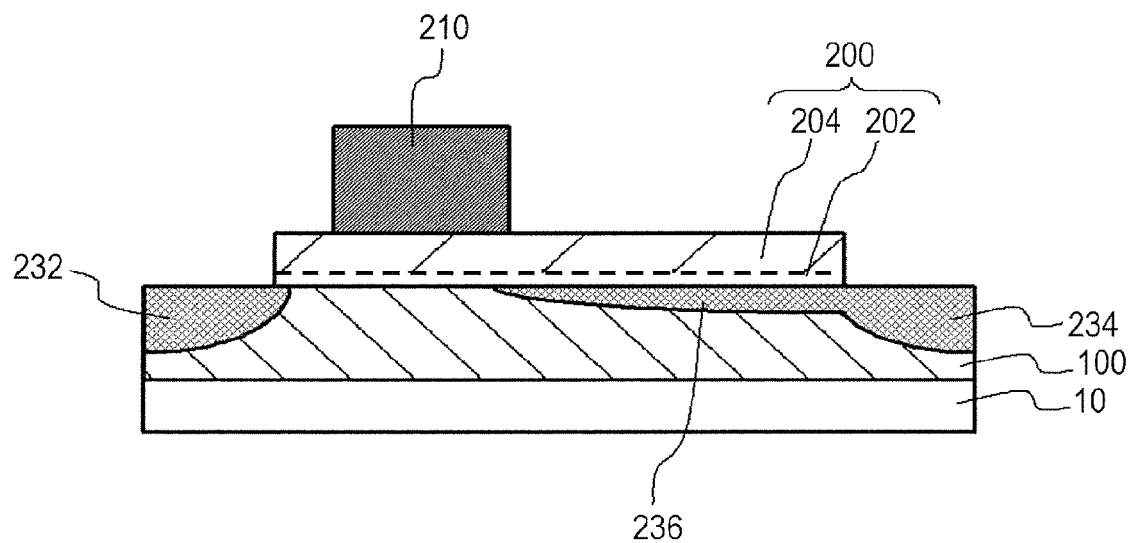
FIG. 11B is a cross sectional view showing a method of manufacturing the semiconductor device shown in FIG. 10 succeeding to, the step shown in FIG. 11A.

Subsequently, as shown in FIG. 11B, the resist pattern 50 is removed. Then, an impurity is implanted into the first nitride semiconductor layer 100 by using the gate electrode 210 and the aluminum oxide layer 200 as a mask. Thus, a source region 232 and a drain region 234 are formed.

Then, a source electrode 222 and a drain electrode 224 are formed.

According to this embodiment, interface states in the aluminum oxide layer 200 as the gate insulating film and the first nitride semiconductor layer 100 are decreased. Accordingly, characteristics, for example, BTI of the field effect transistor are improved.

While the present invention has been described by way of preferred embodiments with reference to the drawings, they are merely illustration of the invention and various configurations other than those described above can also be adopted.

What is claimed is:

1. A method of manufacturing a semiconductor device comprising:
    forming a layer comprising aluminum oxide; and
    heat treating the layer in an atmosphere not containing an oxidizing agent, wherein temperature and time of the heat treating are predetermined as being effective to form, from the layer, an interface layer having a crystal structure containing both tetra-coordinated Al atoms and hexa-coordinated Al atoms, with from 30% to 50% of the Al atoms being tetra-coordinated.

2. The method of manufacturing the semiconductor device according to claim 1, wherein the thickness of the interface layer is 1 nm or more and 3 nm or less.

3. The method of manufacturing the semiconductor device according to claim 1, wherein the temperature of the heat treatment is 500° C. or higher and 1000° C. or lower.

* * * * *